United States Patent
Barford et al.

(10) Patent No.: US 9,874,863 B2
(45) Date of Patent: Jan. 23, 2018

(54) FINITE STATE MACHINE-BASED TRIGGER EVENT DETECTION EMPLOYING INTERPOLATION

(71) Applicant: Keysight Technologies, Inc., Minneapolis, MN (US)

(72) Inventors: Lee A. Barford, Reno, NV (US); Andrew R. Lehane, Edinburgh (GB)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/834,407

(22) Filed: Aug. 24, 2015

(65) Prior Publication Data

US 2017/0060114 A1    Mar. 2, 2017

(51) Int. Cl.
*G05B 19/045* (2006.01)
*G04F 10/00* (2006.01)

(52) U.S. Cl.
CPC .. *G05B 19/045* (2013.01); *G05B 2219/23289* (2013.01)

(58) Field of Classification Search
None
See application file for complete search history.

(56) References Cited

U.S. PATENT DOCUMENTS

| | | | | |
|---|---|---|---|---|
| 6,158,433 A * | 12/2000 | Ong | ............... | A61M 16/0051 128/204.18 |
| 6,201,779 B1 * | 3/2001 | Reed | ............ | G11B 20/10009 360/46 |
| 6,753,677 B1 | 6/2004 | Weller et al. | | |
| 6,850,806 B2 * | 2/2005 | Yutkowitz | ............ | G05B 11/28 700/37 |
| 6,892,150 B2 | 5/2005 | Pickerd et al. | | |
| 7,072,818 B1 * | 7/2006 | Beardslee | ........ | G01R 31/31705 703/14 |
| 7,352,167 B2 | 4/2008 | Sullivan et al. | | |
| 7,373,281 B2 | 5/2008 | Pupalaikis et al. | | |
| 7,373,561 B2 * | 5/2008 | Baumer | ............ | G06F 13/4027 714/704 |
| 7,860,674 B2 | 12/2010 | Freidhof et al. | | |
| 7,877,401 B1 * | 1/2011 | Hostetter | ................ | G06F 7/02 707/758 |
| 9,091,711 B1 * | 7/2015 | Wang | .................... | G01R 23/02 |
| 9,110,524 B1 * | 8/2015 | Jiang | ....................... | G06F 1/04 |
| 2003/0117176 A1 * | 6/2003 | Tardieux | .................. | G06F 1/04 326/93 |

(Continued)

FOREIGN PATENT DOCUMENTS

WO    2007112360 A2    10/2007

*Primary Examiner* — Crystal L Hammond

(57) ABSTRACT

Trigger event detection employs a finite state machine (FSM) and interpolation of time-sampled data. A trigger event detector includes an interpolator configured to interpolate time-sampled data and to provide an interpolated sequence of data. The trigger event detector further includes an FSM that has a plurality of predefined states including a trigger event state. The FSM is configured to transition among the predefined states according to an ordered sequence of symbols corresponding to the interpolated sequence of data. A transition of the FSM into the trigger event state represents detection of a trigger event. The trigger event detection provides one or both of a real-time trigger and a post-acquisition trigger.

20 Claims, 3 Drawing Sheets

(56) References Cited

U.S. PATENT DOCUMENTS

| | | | |
|---|---|---|---|
| 2004/0054297 A1* | 3/2004 | Wingeier | A61B 5/0031 600/544 |
| 2007/0222430 A1* | 9/2007 | Sullivan | G01R 13/0254 324/76.15 |
| 2007/0244950 A1* | 10/2007 | Golic | G06F 7/582 708/250 |
| 2008/0147949 A1* | 6/2008 | Miyake | G06F 11/0739 710/267 |
| 2012/0179933 A1* | 7/2012 | Lo | H04L 1/0045 714/16 |
| 2012/0203761 A1* | 8/2012 | Biran | G06K 9/00986 707/713 |
| 2013/0082662 A1* | 4/2013 | Carre | H02J 7/0052 320/134 |
| 2014/0165722 A1* | 6/2014 | Roselli | G06F 1/1613 73/488 |
| 2014/0330134 A1 | 11/2014 | Chon et al. | |
| 2014/0358837 A1* | 12/2014 | Lehane | G06N 5/047 706/48 |
| 2015/0103875 A1* | 4/2015 | Thakkar | H04L 25/03057 375/233 |
| 2016/0179073 A1* | 6/2016 | Lehane | G05B 19/045 326/46 |

* cited by examiner

FINITE STATE MACHINE-BASED TRIGGER EVENT DETECTION EMPLOYING INTERPOLATION

CROSS-REFERENCE TO RELATED APPLICATIONS

This application is related to a co-pending U.S. patent application Ser. No. 14/313,884, entitled "Digital Triggering Using Finite State Machines," filed Jun. 24, 2014, which is incorporated by reference herein in its entirety.

STATEMENT REGARDING FEDERALLY SPONSORED RESEARCH OR DEVELOPMENT

N/A

BACKGROUND

Modern systems often employ detection of certain events to initiate or 'trigger' one or more actions or reactions by the system. These so-called 'trigger events' may include, for example, a change in local environment or a change in a characteristic of a signal monitored by the system. For example, oscilloscopes have long employed triggers based on characteristics of an input signal to synchronize or coordinate measurements performed by the oscilloscope. In an analog oscilloscope, a rising or falling edge of an input signal may be used to synchronize a display sweep to facilitate displaying the input signal in a vicinity of the rising or falling edge, for example. With the advent of digital systems and more particularly digital data acquisition systems such as, but not limited to, digital oscilloscopes, the synchronization or coordination has been naturally extended to include one or both of starting and stopping the acquisition of data based on the occurrence of a particular trigger event. Starting and/or stopping data acquisition according to a trigger event may be used to ensure that a portion of the input signal around the trigger event is present in the data acquired, for example.

In early digital versions of various data acquisition systems, analog trigger event detection, often derived directly from an analog version of the data acquisition system, may have been employed. However, there has been a general trend toward replacing analog trigger event detection with digital trigger event detection in modern systems to overcome some of the inherent limitations of using analog-based trigger event detection.

BRIEF SUMMARY

In some embodiments of the principles described herein, a trigger event detector is provided. The trigger event detector comprises an interpolator configured to interpolate time-sampled data and to provide an interpolated sequence of data. The trigger event detector further comprises a finite state machine (FSM) having a plurality of predefined states including a trigger event state. The FSM is configured to transition among the predefined states according to an ordered sequence of symbols corresponding to the interpolated sequence of data. A transition of the FSM into the FSM trigger event state represents detection of a trigger event, wherein the trigger event detection provides one or both of a real-time trigger (RTT) and a post-acquisition trigger (PAT).

In some embodiments of the principles described herein, a data acquisition system with finite state machine-based trigger event detection is provided. The data acquisition system comprises an analog-to-digital converter (ADC) configured to receive an analog signal and to convert the analog signal into time-sampled digital data. The data acquisition system further comprises an interpolator configured to provide interpolated digital data from the time-sampled digital data. The data acquisition system further comprises a symbol generator configured to map the interpolated digital data into an ordered sequence of symbols. A symbol represents a predetermined range of digital values of the interpolated digital data. The data acquisition system further comprises a finite state machine (FSM) configured to transition among a predefined set of states according to the ordered sequence of symbols. Trigger event detection of a trigger event comprises a transition of the FSM into a trigger event state of the predefined set of states.

In other embodiments of the principles described herein, a method of trigger event detection is provided. The method of trigger event detection comprises interpolating time-sampled data using an interpolator to provide an interpolated sequence of data. The method of trigger event detection further comprises generating an ordered sequence of symbols corresponding to the interpolated data sequence using a symbol generator to map data points of the interpolated data sequence into a set of symbols representing digital values of the data points. The method of trigger event detection further comprises transitioning a finite state machine (FSM) among a plurality of predefined states according to the ordered sequence of symbols, wherein the predefined states include a trigger event state. The method of trigger event detection further comprises detecting a trigger event as a transition of the FSM into the trigger event state and providing one or both of a real-time trigger (RTT) and a post-acquisition trigger (PAT) upon detection of the trigger event.

BRIEF DESCRIPTION OF THE DRAWINGS

Various features of embodiments and examples in accordance with the principles described herein may be more readily understood with reference to the following detailed description taken in conjunction with the accompanying drawings, where like reference numerals designate like structural elements, and in which.

Figure 1:
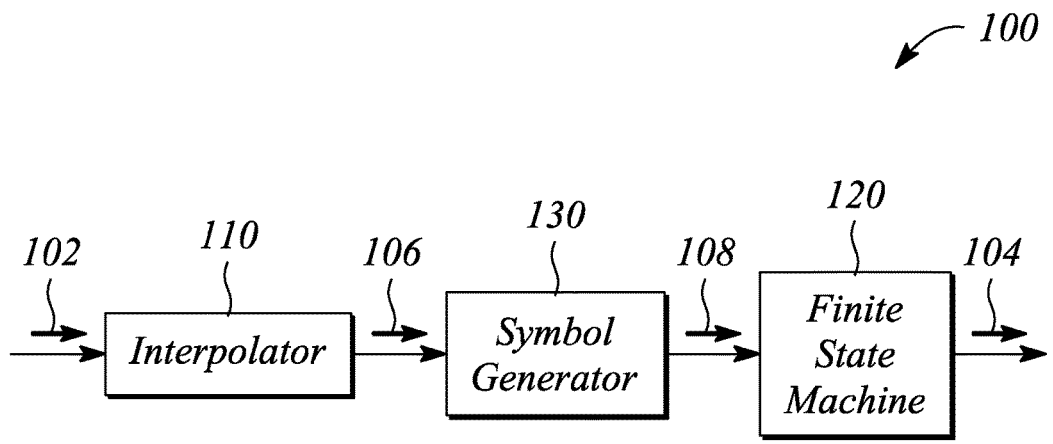
FIG. 1 illustrates a block diagram of a trigger event detector in an example, according to an embodiment consistent with the principles described herein.

Certain examples and embodiments have other features that are one of in addition to and in lieu of the features illustrated in the above-referenced figures. These and other features are detailed below with reference to the above-referenced figures.

DETAILED DESCRIPTION

Embodiments and examples consistent with the principles described herein provide detection of a trigger event using interpolation and a finite state machine. In particular, interpolation is employed to provide interpolated data from time-sampled data. A finite state machine (FSM) is then used to search through the interpolated data for an occurrence of a predefined trigger event. The FSM may include a plurality of different trigger event states corresponding to a corresponding plurality of different trigger events. As a result, FSM-based trigger event detection according to various embodiments of the principles described herein may detect any of the trigger events of the different trigger event plurality. Further, according to various embodiments, interpolation may effectively increase a time resolution of the trigger event search provided by FSM-based trigger event detection as compared to using the time-sampled data without interpolation. For example, the interpolation may provide the interpolated data having a time resolution that is at least two times the time resolution of time-sampled data. As such, higher precision timing of the detected trigger event may be provided. According to various embodiments, the FSM-based trigger event detection with interpolation provides one or both of a real-time trigger (RTT) and a post-acquisition trigger (PAT). The RTT may be employed to terminate data acquisition (e.g., of a data acquisition system such as, but not limited to, a digital oscilloscope), and the PAT may be used to establish trigger event timing within previously acquired data, according to various embodiments.

Herein, a 'finite state machine' is broadly defined as a construct or automaton that has a finite plurality of states. In particular, a finite state machine, as defined herein, is any computational model or sequential logic structure that includes a list of states and a set of constraints specifying a transition from one state to another within the list. Further, by definition herein, 'a transition between states' in a finite state machine is provided by or more precisely is controlled by an input to the finite state machine. As such, the finite state machine is said to transition between states according to an input to the finite state machine.

In some examples and embodiments herein, the finite state machine may be 'in' or exhibit only one of the states at any particular moment in time. In other examples and embodiments, the finite state machine may be in more than one state at a time. In particular, the finite state machine may comprise or be implemented as a non-deterministic finite automaton (NFA) or using a semigroup computation, for example. As such, by definition herein, the finite state machine may also include various multi-state implementations including, but not limited to, an NFA, a finite state machine implemented using semigroup or parallel computation and other multi-state and multi-symbol finite state machines as described in co-pending U.S. patent application Ser. No. 14/313,884 and U.S. Pat. No. 8,666,925, incorporated herein by reference in its entirety.

According to various embodiments and examples herein, a finite state machine may be represented by or alternatively may implement a state diagram. The state diagram is a diagram that includes vertices or nodes corresponding to the various states and edges that serve as interconnections between the states. The edges, in turn, define the transitions between the states according to the finite state machine input. Herein, a finite state machine is employed to detect a trigger event within a set of input data. Examples of a variety of implementations of finite state machines used to implement trigger event detection can be found in co-pending U.S. patent application Ser. No. 14/313,884, entitled, "Digital Triggering Using Finite State Machines," incorporated in its entirety by reference herein.

Embodiments consistent with the principles described herein may be implemented using a variety of devices and circuits including, but not limited to, integrated circuits (ICs), very large scale integrated (VLSI) circuits, application specific integrated circuits (ASIC), field programmable gate arrays (FPGAs) and the like, firmware, software, or a combination of two or more of the above. For example, elements or 'blocks' of an implementation consistent with the principles described herein may all be implemented as circuit elements within an ASIC or a VLSI circuit. Implementations that employ an ASIC or a VLSI circuit are examples of hardware-based circuit implementation, for example. In another example, the entire apparatus may be implemented as software using a computer programming language (e.g., C/C++) or software-based modeling environment (e.g., Matlab®, MathWorks, Inc., Natick, Mass.). Implementation of the entire apparatus as software is an example of a software implementation. In yet another example, some of the blocks may be implemented using actual circuitry (e.g., as an IC or an ASIC) while other blocks may be implemented in software or firmware. The principles described herein are not limited to any one of these implementations.

Herein, a 'non-transitory computer readable medium' is defined as substantially any data storage medium that provides non-transitory storage of information that may be read, executed, or otherwise utilized by a computer or equivalent processor. Computer readable memory including, but not limited to, random access memory (RAM), read-only memory (ROM), programmable or erasable ROM and flash memory (e.g., a thumb drive) are each a non-transitory computer readable medium, by definition herein. Other non-transitory computer readable medium include, but are not limited to, various types of magnetic disks and disk drives (e.g., a hard disk drive, a floppy disk drive, a floppy diskette, etc.), and various optical discs and disc drives (e.g., CD, CD-R, CD-RW, DVD, etc.), by definition herein. In addition, network attached storage, so-called 'cloud' storage (e.g., remote data storage accessible via the Internet), or various other types of computer readable medium used by modern computing systems may be non-transitory computer readable medium, by definition herein.

Further, as used herein, the article 'a' is intended to have its ordinary meaning in the patent arts, namely 'one or more'. For example, 'a trigger event state' means one or more trigger event states and as such, 'the trigger event state' means 'the trigger event state(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or depending on the embodiment, may mean plus or minus 10%, or plus or minus 5%, or plus or minus 1%, unless otherwise expressly specified. Further, the term 'substantially' as used herein means a majority, or almost all, or all, or an amount within a range of about 51% to about 100%.

Moreover, examples herein are intended to be illustrative only and are presented for discussion purposes and not by way of limitation.

In accordance with some embodiments of the principles described herein, a trigger event detector is provided. The trigger event detector is configured to detect the presence of a predetermined or predefined event representing a trigger event. The trigger event may be a particular pattern or feature within data (e.g., digital data pattern) received by the trigger event detector, for example. Upon detection of the particular pattern or feature, the trigger event detector is configured to issue or otherwise provide a trigger or trigger signal. According to various embodiments, the trigger event detector is configured to provide one or both of a real-time trigger (RTT) and a post-acquisition trigger (PAT), as described further below.

FIG. 1 illustrates a block diagram of a trigger event detector 100 in an example, according to an embodiment consistent with the principles described herein. The trigger event detector 100 is configured to receive and operate on input data 102 (e.g., time-sampled data received at an input port). The input data 102 may be digital data, for example. The trigger event detector 100 is configured to issue or provide a trigger output, trigger signal or simply a 'trigger' 104 at an output of the trigger event detector 100. For example, the trigger 104 may be either an RTT or a PAT. The input data 102 and the trigger 104 are illustrated using bold arrows in FIG. 1.

As illustrated in FIG. 1, the trigger event detector 100 comprises an interpolator 110. The interpolator 110 is configured to interpolate the time-sampled data 102 received at the input port. Further, the interpolator 110 is configured to provide an interpolated sequence of data 106 (also referred to as 'interpolated data sequence 106') generated from the time-sampled data 102. According to various embodiments, the time-sampled data 102 may represent data (e.g., a data sequence) derived from a process or signal that is a function of time (e.g., x(t)). For example, the signal may be an analog signal x(t). As such, the time-sampled data 102 may be a time series (e.g., x[n]) indexed on an integer n corresponding to sequential time samples of the signal (e.g., analog signal) or process x(t). The time series may comprise successive measurements made over a time interval, for example. In some embodiments, the time interval may be constant and the time series may represent successive measurements made over a constant or periodic time interval. The measurements may be represented by digital values, in some examples.

According to some embodiments, the interpolator 110 is further configured to receive the time-sampled data 102 as the time series in 'real-time' or near real-time. By definition herein, 'real-time' means that there is little or substantially no delay in the receipt of the time-sampled data by the interpolator. In particular, the time-sampled data 102 may represent successive measurements of a process that is a function of time and the interpolator 110 may be configured to receive the time-sampled data 102 directly from the process. For example, the time-sampled data 102 may be received from an analog-to-digital converter (ADC), e.g., as described below. The ADC may be configured to sample an analog signal (e.g., applied to an input of the ADC) and the time-sampled data 102 may represent time samples of the analog signal represented by or having digital values. Thus, the trigger event detector 100 may further comprise the ADC (not illustrated in FIG. 1) configured to receive and convert an analog signal into the time-sampled data 102 (e.g., digital data), according to some embodiments. Further, according to some embodiments, the RTT may be configured to terminate conversion of the analog signal into the time-sampled data 102.

According to other embodiments, the interpolator 110 is further configured to receive the time-sampled data 102 from a memory. The memory may be configured to store the time-sampled data 102 (or time-sampled data sequence) prior to interpolation by the interpolator 110, according to various embodiments. For example, the memory may store time-sampled data 102 provided by the ADC. After the time-sampled data 102 is stored, the memory may provide the time-sampled data 102 as a sequence to the interpolator 110 for interpolation. Thus, the trigger event detector 100 may further comprise the memory (not illustrated in FIG. 1). The memory may be configured to store one or both of the time-sampled data 102 and the interpolated data sequence 106, according to some embodiments. Further, according to some embodiments, the PAT may be configured to establish a timing or location of the trigger event within the memory-stored data.

According to various embodiments, the interpolator 110 may be configured to interpolate the time-sampled data 102 according to substantially any interpolation. For example, the interpolation may include, but is not limited to, piece-wise constant interpolation, linear interpolation, polynomial interpolation, and spline interpolation. The interpolation may also include various curve fitting approximations to an underlying function representing the time-sampled data 102, e.g., representing the analog process or signal x(t).

According to some embodiments, the interpolated data sequence 106 has a time resolution that is at least twice a time resolution of the time-sampled data 102. For example, a linear interpolation may be employed to generate an interpolated value between each sample of the time-sampled data 102 to provide the interpolated data sequence 106 having twice as many data points or 'samples' as the time-sampled data 102. By doubling the number of data points, the interpolated data sequence 106 effectively has a time resolution that is at least twice the time resolution of the pre-interpolation, time-sampled data 102. Similarly, an interpolation that provides two data points, four data points, and so on, between each sample of the time-sampled data 102 may provide an interpolated data sequence 106 having time resolutions that are respectively four times, eight times, and so on, the time resolution of the time-sampled data 102.

According to some embodiments, the interpolation may include or be based on Whittaker-Shannon interpolation. In particular, the interpolator 110 may be configured to interpolate the time-sampled data 102 according to a Whittaker-Shannon interpolation. In general, Whittaker-Shannon interpolation provides an interpolation result x'(t) as a continuous function of time t as given by equation (1)

$$x'(t) = \sum_{n=-\infty}^{\infty} x[n] \cdot \text{sinc}\left(\frac{t - nT}{T}\right) \tag{1}$$

where x[n] are data samples representing a sequence of n real numbers, sin c(·) is a 'sin c' function, and T is an interval defined as the inverse of a sample rate $f_s$ of the samples (i.e., $T=1/f_s$). The data samples x[n] may be data samples of the time-sampled data 102, for example. According to Shannon's sampling theorem, the Whittaker-Shannon interpolation represents a so-called 'perfect' reconstruction of an original process from which the data samples x[n] are derived if the sampling function is band limited to less than a Nyquist frequency.

The interpolation result x'(t) may be re-sampled at a higher sampling rate than $f_s$ to provide the interpolated data sequence 106 represented by x'[m], where m=k·n and k>1, according to various embodiments. In particular, the interpolated data sequence 106 may be provided with at least twice the time resolution of the time-sampled data 102 by resampling the interpolated value x(t) at a sampling rate $f'_s$ that is equal to or greater than two times the sample rate $f_s$ of the data samples x[n] (e.g., using k=2). According to some embodiments, an approximation of Whittaker-Shannon interpolation may be employed.

According to various embodiments, the interpolator 110 may be implemented as one or more of hardware, firmware or software. For example, the interpolator 110 may comprise a finite impulse response (FIR) filter configured to provide the interpolation. The FIR filter may be realized in hardware as dedicated circuits (e.g., as an ASIC) or using a field programmable gate array (FPGA) or similar circuit construct. In another example, the FIR filter may be implemented using firmware or software executed by a processor (e.g., a general purpose processor, a signal processor, another specialized processor). Other hardware, software and firmware implementations may also be employed instead of or in addition to the FIR filter.

For example, instead of using the FIR filter, another implementation may employ substantially all past data samples or an infinite impulse (IIR) filter approximation. In another example, a cubic spline interpolation may be employed. A cubic spline may be computed that passes through a plurality of adjacent data samples (e.g., four adjacent data samples x[i], x[i+1], x[i+2], and x[i+3], where i is an index of a current data sample). Values of the computed cubic spline then may be used to perform interpolation between any two of the adjacent (e.g. any two of the four) data samples.

As illustrated in FIG. 1, the trigger event detector 100 further comprises a finite state machine (FSM) 120 having a plurality of predefined states including a trigger event state. The FSM 120 is configured to transition or cycle among the predefined states of the plurality according to an ordered sequence of symbols 108. The ordered sequence of symbols 108 corresponds to the interpolated sequence of data 106, according to various embodiments. According to various embodiments, a transition of the FSM 120 into the trigger event state represents detection of a trigger event. In particular, the transition into the trigger event state represents detection of the trigger event in the interpolated sequence of data 106 and, by extension, within the time-sampled data 102 as well.

According to various embodiments, the FSM 120 may be substantially similar to the finite state machine described in co-pending U.S. patent application Ser. No. 14/313,884, incorporated by reference above. For example, the FSM 120 may implement a state diagram that includes the predefined states. Further, for example, the FSM 120 may be or comprise a multi-symbol finite state machine (MSFSM) configured to change from a current state to another one of the predefined states of the plurality in response to the receipt of a symbol of the ordered sequence of symbols 108. The FSM 120 may be configured to detect a plurality of different trigger events, wherein detection of any one of which may result in the issuance of a trigger by the trigger event detector 100, for example. A variety of example finite state machine configurations applicable to the FSM 120 can be found in the above-referenced co-pending patent application.

According to various embodiments, the ordered sequence of symbols 108 employed by the FSM 120 may include or be made up of symbols of or selected from a plurality of different or distinct symbols. For example, there may be two, three, four or more different or distinct symbols from which the symbols of the ordered sequence of symbols 108 are selected. In some embodiments, the plurality of different symbols includes at least three different symbols (e.g., 'L', 'M', and 'H', as described below). In other examples, there may be eight different symbols or sixteen different symbols in the plurality of different symbols used to produce the ordered sequence of symbols. In some examples, there may be as many different symbols as there are possible values in the interpolated data sequence 106. In fact, the data points themselves, e.g., as represented by a digital value, of the interpolated data sequence 106 may be the symbols, in some embodiments.

According to various embodiments, a symbol of the ordered sequence of symbols 108 represents a data point (or datum) of the interpolated data sequence 106. In some embodiments, each symbol in the ordered sequence of symbols 108 may represent a single data point such that the ordered sequence of symbols 108 includes a number of individual symbols equal to a number of data points in the interpolated data sequence 106. As such, there may be a one-to-one correspondence between symbols and data points (i.e., one symbol for each data point), in some embodiments. In other embodiments, a symbol may represent a plurality of data points (e.g., an average of two or more data points), such that a symbol represents a subset of the data points of the interpolated data sequence 106.

In some embodiments (e.g., as illustrated in FIG. 1), the trigger event detector 100 further comprises a symbol generator 130 located between the interpolator 110 and the FSM 120. The symbol generator 130 is configured to map or convert the interpolated data sequence 106 into the ordered sequence of symbols 108 comprising the plurality of different symbols. According to some embodiments, each different symbol of the plurality represents a range of values (e.g., a range of digital values) of the interpolated data sequence 106.

For example, the plurality of different symbols may have three different symbols 'L', 'M', and 'H' respectively representing 'low' values, 'medium' values and 'high' values. The low values corresponding to the symbol 'L' may be values of the interpolated data sequence 106 that are below a first threshold. The high values corresponding to the symbol 'H' may be interpolated data sequence 106 values that are above a second threshold that, in turn, is above the first threshold. For example, the first threshold value may be adjacent to a low end of a total range of values or potential values of the interpolated data sequence 106, while the second threshold value may be adjacent to a high end of the value range. The medium values corresponding to the symbol 'M' may correspond to values between the first and second threshold values. As such, the symbol generator 130 may be configured to map a value in the interpolated data sequence 106 that is below the first threshold into the symbol 'L', to map a value in the interpolated data sequence 106 that is between the first and second thresholds into the symbol 'M', and to map a value in the interpolated data sequence 106 above the second threshold into the symbol 'H'.

In some embodiments, different ranges of values of the interpolated data sequence 106 corresponding to the different symbols may be uniformly distributed across a total range of values of the interpolated data sequence 106. In particular, the total range of values may be divided into substantially equal-sized different portions and each of the different symbols may represent a different one of the substantially equal-sized different portions. For example, the first and second thresholds described above may be equally spaced from the low and high ends, respectively, to divide the total value range into three substantially equal-sized portions. In other embodiments, the different ranges of values corresponding to the different symbols are not equally spaced or may not represent substantially equal-sized portions. In some embodiments, the different ranges may overlap one another and the symbol generator 130 may be configured to determine the mapping using additional criteria in addition to the values (e.g., a previous mapped value, for example).

Figure 2A:
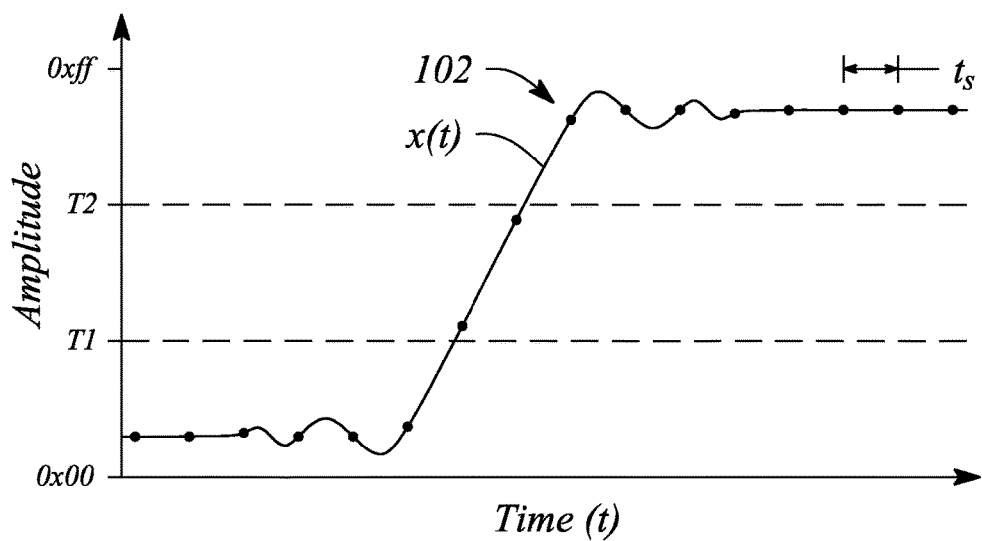
FIG. 2A illustrates a plot of an example of time-sampled data as a function of time, according to an embodiment consistent with the principles described herein.

FIG. 2A illustrates a plot of an example of time-sampled data 102 as a function of time, according to an embodiment consistent with the principles described herein. In particular, dots illustrated in FIG. 2A correspond to individual time-sampled data points or 'time samples' of the time-sampled data 102. As illustrated, the time samples have a sample period $t_s$ representing a time resolution of the time-sampled data 102. Further, an illustrated curve represents an analog signal or process x(t) from which the time-sampled data 102 were derived. The curve also represents an underlying function that represents the analog signal or process x(t). Each of the dots may represent a separate, sampled data point produced by an ADC, for example. The plot illustrated in FIG. 2A depicts time 't' on an x-axis and amplitude or digital value of the time samples on a y-axis (e.g., ranging from 0x00 to 0xff). Further, a spacing on the x-axis between the sampled data points (dots) represent a sample period or interval employed by the ADC in sampling the analog signal or process x(t), for example.

Figure 2B:
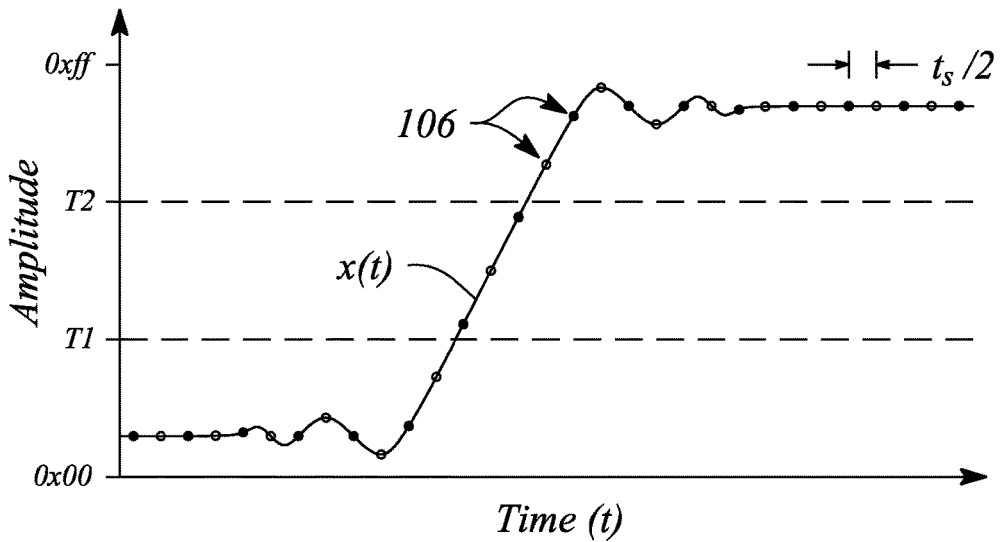
FIG. 2B illustrates a plot of an example of an interpolated sequence of data corresponding to the time-sampled data of FIG. 2A, in an embodiment consistent with the principles described herein.

FIG. 2B illustrates a plot of an example of an interpolated sequence of data 106 corresponding to the time-sampled data 102 of FIG. 2A, in an embodiment consistent with the principles described herein. Interpolated data points are illustrated as a combination of dots and circles or 'open' dots in FIG. 2B. The open dots represent new data points added by the interpolation and interspersed between the 'original' time-sampled data points (i.e., dots). The interpolated data illustrated in FIG. 2B may be or represent a result of interpolating the time-sampled data 102 of the FIG. 2A using the interpolator 110, for example. As illustrated, the interpolated data 106 has a time resolution that is twice a time resolution of the time-sampled data 102, by way of example and not limitation.

Also illustrated in FIGS. 2A and 2B are a first threshold T1 and a second threshold T2 (e.g., illustrated as horizontal dashed lines). In particular, a total value range of the interpolated data 106 in FIG. 2B based on an 8-bit digital format is from 0x00 to 0xff (e.g., using a hexadecimal representation). As illustrated, the first threshold T1 and the second threshold T2 divide the total value range into three portions, namely digital value ranges [0x00-0x20], [0x21-0xde], and [0xdf-0xff], corresponding respectively to the low values, the medium values, and the high values, respectively. Using the thresholds illustrated in FIG. 2B, an example symbol generator 130 may produce an ordered sequence of symbols W from the interpolated sequence of digital data as given by:

W={ . . . L, L, L, M, M, M, H, H, H, H, . . . } where 'L', 'M', and 'H' are the symbols corresponding to the low, medium and high values (i.e., digital values) described above.

Figure 2C:
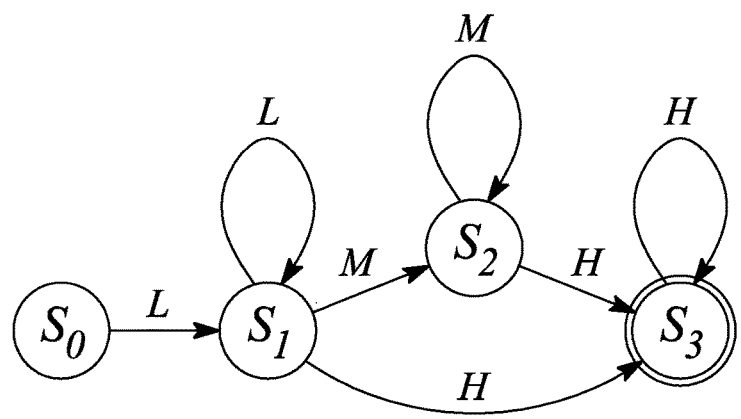
FIG. 2C illustrates a state diagram of a finite state machine in an example, according to an embodiment consistent with the principles described herein.

FIG. 2C illustrates a state diagram of the FSM 120 in an example, according to an embodiment consistent with the principles described herein. As illustrated in FIG. 2C, the state diagram may implement detection of a rising-edge trigger event, for example. In particular, the illustrated state diagram includes a plurality of states $S_m$, where m=0, 1, 2 and 3 along with edges (arrows) defining transitions between the states. The edges are labeled with a symbol corresponding to a transition that is produced by receipt of the symbol. For example, an edge labeled 'L' represents a transition in the state diagram (and of the FSM 120) produced by receipt of the symbol 'L' in the ordered sequence of symbols W. When the ordered sequence of symbols W is applied to the FSM 120 that includes the state diagram illustrated in FIG. 2C, a rising-edge event may be detected by transition into the event trigger state $S_3$ illustrated with a double border, for example. For additional examples of trigger events and corresponding state diagrams, see the co-pending U.S. patent application Ser. No. 14/313,884, referenced above. Inclusion here of the rising-edge trigger event example is intended for illustration purposes only and not by way of limitation.

In some embodiments according to the principles described herein, a data acquisition system is provided. The data acquisition system includes or employs finite state machine-based trigger event detection. The data acquisition system may represent, but is not limited to, a digital oscilloscope, a digital voltmeter, a digital ammeter, a spectrum analyzer, a spectrum monitoring system, a protocol analyzer, a semiconductor or circuit board test system, an analog-to-digital converter-based data acquisition subsystem, or any of a variety of similar data acquisition systems. A real-time trigger (RTT) of the data acquisition system may be employed to terminate data acquisition, and a post-acquisition trigger (PAT) of the data acquisition system may be used to establish trigger event timing within previously acquired data, according to various embodiments.

Figure 3:
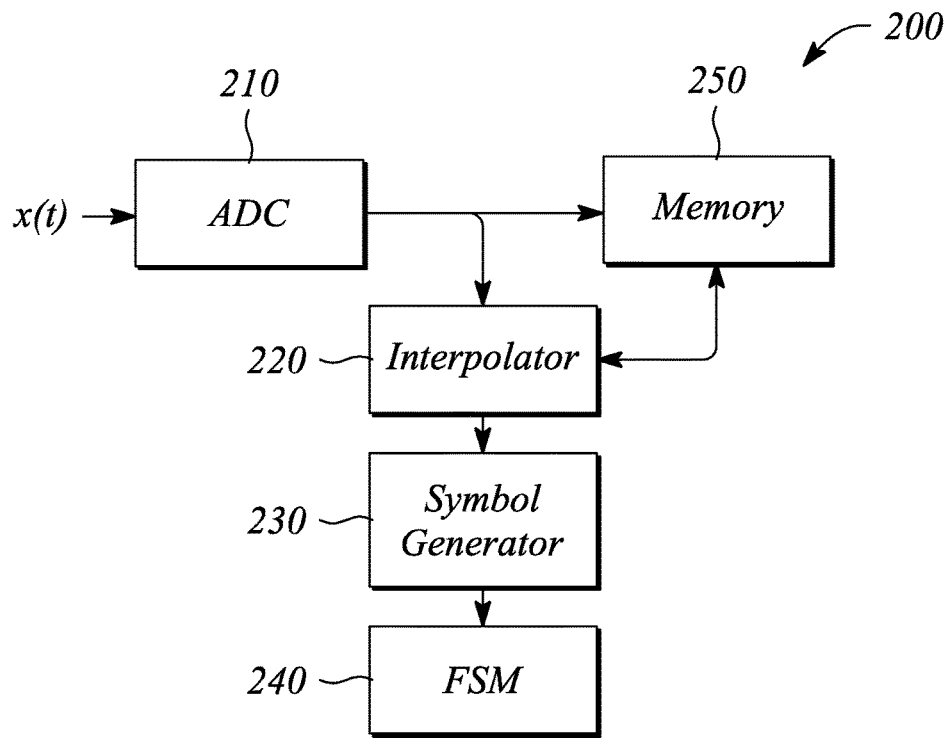
FIG. 3 illustrates a block diagram of a data acquisition system in an example, according to an embodiment consistent with the principles described herein.

FIG. 3 illustrates a block diagram of a data acquisition system 200 in an example, according to an embodiment consistent with the principles described herein. As illustrated in FIG. 3, the data acquisition system 200 is configured to receive an analog signal x(t). The analog signal x(t) generally varies with time and may represent substantially any analog process including, but not limited to, an analog signal provided by an electrical or mechanical process, an audio signal, or a radio frequency (RF) or microwave signal.

The data acquisition system 200 illustrated in FIG. 3 comprises an analog-to-digital converter (ADC) 210. The ADC 210 is configured to receive and convert the analog signal x(t) into time-sampled digital data. According to some embodiments, the ADC 210 and the previously described ADC of the trigger event detector 100 may be substantially similar. In particular, the ADC 210 may be substantially any ADC or use substantially any ADC architecture including, but not limited to, a direct-conversion or 'flash' ADC, a successive-approximation ADC, a ramp-compare ADC, an integrating ADC, a delta-encoded ADC, a sigma-delta ADC, and a time-interleaved ADC. For example, the ADC 210 may be any ADC typically employed in a digital oscilloscope, a digital voltmeter/ammeter, or a spectrum analyzer.

As illustrated in FIG. 3, the data acquisition system 200 further comprises an interpolator 220. The interpolator 220 is configured to provide interpolated digital data from the time-sampled digital data. According to some embodiments, the interpolator 220 may be substantially similar to the interpolator 110 described above with respect to the trigger event detector 100. For example, the interpolator 210 may implement one or more of piecewise constant interpolation, linear interpolation, polynomial interpolation, spline interpolation, and Whittaker-Shannon interpolation or an approximation thereof. Further, the interpolated digital data provided by the interpolator 220 may have a time resolution that is at least twice the time resolution of the time-sampled digital data, according to some embodiments.

The data acquisition system 200 illustrated in FIG. 3 further comprises a symbol generator 230. The symbol generator 230 is configured to map the interpolated digital data provided by the interpolator 220 into an ordered sequence of symbols. According to various embodiments, a symbol of the ordered sequence of symbols represents a predetermined range of digital values of the interpolated digital data. In some embodiments, the symbol generator 230 may be substantially similar to the symbol generator 130 of the trigger event detector 100, described above. In particular, the symbol generator 230 may employ a set of different symbols into which the interpolated digital data is mapped. The set of different symbols may have substantially any number of different symbols including, but not limited to, two symbols, three symbols, four different symbols, five symbols, six symbols, seven symbols, eight symbols, and sixteen symbols. Further, the different symbols may represent different ranges of digital values.

For example, the ordered sequence of symbols produced by the symbol generator 230 may comprise symbols selected from a set of at least three different symbols, each of the different symbols representing a respective different range of digital values of the interpolated digital data. Each of the different symbols of the set may represent a substantially equal portion of a total range of digital values of the interpolated digital data, for example. Alternatively, the different symbols of the set may represent substantially unequal portions of the total range, in other examples.

As illustrated in FIG. 3, the data acquisition system further comprises a finite state machine (FSM) 240. The FSM 240 is configured to transition (or cycle) among a predefined set of states according to the ordered sequence of symbols received from the symbol generator 230. The predefined set of states comprises a trigger event state. According to some embodiments, the FSM 240 is substantially similar to the FSM 120 described above with respect to the trigger event detector 100. In particular, detection of a trigger event comprises a transition of the FSM 240 into a trigger event state of the predefined set of states. Moreover, the FSM 240 may be configured to detect any trigger event of a plurality of different trigger events from the set of predefined states by a concomitant transition of the FSM 240 into the respective trigger event state.

According to some embodiments, the trigger event detection is configured to provide one or both of a real-time trigger (RTT) and a post-acquisition trigger (PAT). The RTT may be configured to terminate sampling (and conversion) of the analog signal x(t) into the time-sampled digital data by the ADC 210. The PAT may be configured to establish a timing of the trigger event within the interpolated digital data. The established trigger event timing may provide a location or time value of the trigger event, for example. Moreover, a timing precision of either the RTT or the PAT may be improved relative to one or both of an RTT and a PAT provided using the time-sampled digital data (e.g., without interpolation by the interpolator 220).

According to some embodiments (e.g., as illustrated in FIG. 3), the data acquisition system 200 may further comprise a memory 250. The memory 250 may include, but is not limited to, random access memory (RAM) and flash memory, for example. The memory 250 is configured to store one or both of the time-sampled digital data and the interpolated digital data. In particular, the memory 250 may be connected to an output of the ADC 210 to receive and store time-sampled digital data from the ADC 210 (e.g., in real time). According to some embodiments, the interpolator 220 is further configured to selectively receive the time-sampled digital data either from the memory 250 to implement a post-acquisition trigger (PAT) or from the ADC 210 to implement a real-time trigger (RTT) of the data acquisition system 200. As illustrated in FIG. 3, the memory 250 also may be connected to receive the interpolated digital data from the interpolator 220 and to store the received interpolated digital data for latter access and use (e.g., by the FSM 240 to implement a PAT at a later time).

Figure 4:
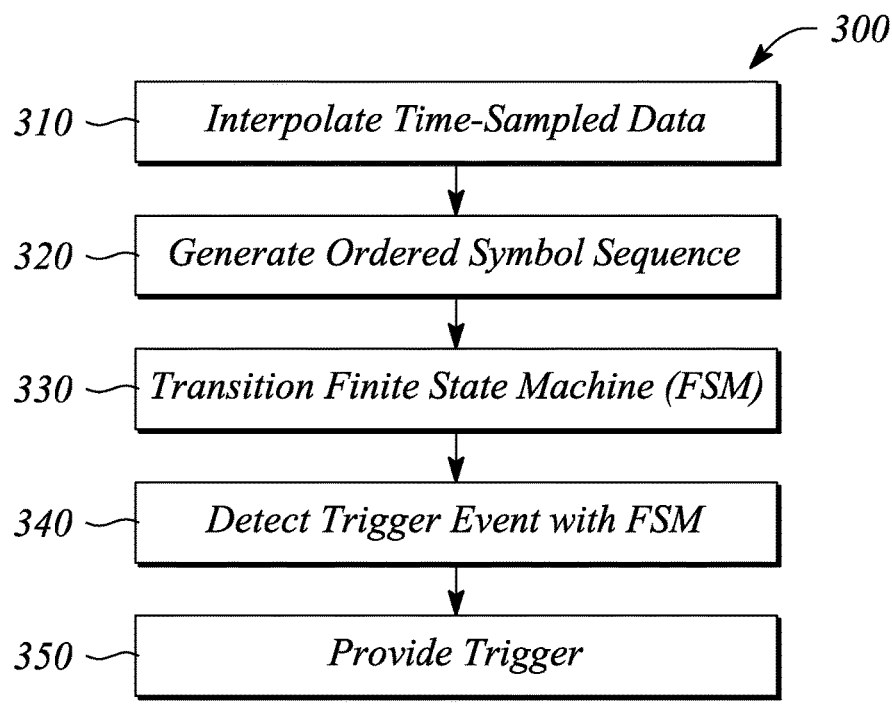
FIG. 4 illustrates a flow chart of a method of trigger event detection in an example, according to an embodiment of the principles described herein.

In some embodiments according to the principles described herein, a method of trigger event detection is provided. In particular, the method of trigger event detection employs a finite state machine to detect trigger events. FIG. 4 illustrates a flow chart of a method 300 of trigger event detection in an example, according to an embodiment of the principles described herein. As illustrated in FIG. 4, the method 300 of trigger event detection comprises interpolating 310 time-sampled data (e.g., a sequence of time-sampled data) using an interpolator to provide an interpolated sequence of data. According to some embodiments, the interpolator used in interpolating 310 the time-sampled data may be substantially similar to the interpolator 110 described above with respect to the trigger event detector 100. For example, interpolating 310 the time-sampled data may employ an interpolator configured to perform one or more of several different interpolations, as described above. In particular, interpolating 310 the time-sampled data sequence may comprise performing a Whittaker-Shannon interpolation, for example. Further, the interpolated data sequence may have a time resolution that is at least twice a time resolution of the time-sampled data.

The method 300 of trigger event detection illustrated in FIG. 4 further comprises generating 320 an ordered sequence of symbols corresponding to the interpolated data sequence. In particular, generating 320 an ordered sequence of symbols uses a symbol generator to map data points (i.e., individual datum) of the interpolated data sequence into a set of symbols representing the digital values of the data points. According to some embodiments, the symbol generator and the generated 320 ordered sequence of symbols are substantially similar to the symbol generator 130 and the ordered sequence of symbols of the trigger event detector 100, described above. For example, generating 320 the ordered sequence of symbols may map the data points according to their digital values into at least three different symbols, where each of the different symbols represents a respective different range of digital values of the interpolated data sequence.

As illustrated in FIG. 4, the method 300 of trigger event detection further comprises transitioning 330 a finite state machine (FSM) among a plurality of predefined states according to the ordered sequence of symbols, wherein the predefined states include a trigger event state. According to some embodiments, the FSM transitioning 330 and the FSM are substantially similar to the FSM 120 and the FSM 120 transition described above with respect to the trigger event detector 100. In particular, the FSM used in the FSM transitioning 330 may implement one or more state diagrams having the plurality of predefined states to describe or define the trigger event. Examples of a number of such state diagrams as well as the FSM are described in co-pending U.S. patent application Ser. No. 14/313,884, incorporated by reference above.

According to various embodiments (e.g., as illustrated in FIG. 4), the method 300 of trigger event detection further comprises detecting 340 a trigger event comprising a transition of the FSM into the trigger event state. Further, according to various embodiments, the method 300 of trigger event detection further comprises providing 350 a trigger comprising one or both of a real-time trigger (RTT) and a post-acquisition trigger (PAT) upon detection 340 of the trigger event, as illustrated in FIG. 4 by way of example.

In some embodiments (not illustrated in FIG. 4), the method 300 of trigger event detection further comprises acquiring the time-sampled data using an analog-to-converter (ADC) to sample and convert an analog signal into digital samples of the time-sampled data. The ADC used in acquiring the time-sampled data may be substantially similar to either the ADC described above with respect to the trigger event detector 100 or the ADC 210 described above with respect to the data acquisition system 200. Further, in some embodiments (not illustrated), the method 300 of trigger event detection may comprise storing the time-sampled data in a memory (e.g., a memory of a data acquisition system). For example, the memory may be substantially similar to the memory 250 of the data acquisition system 200, described above. Further according to some embodiments, providing 350 one or both of the RTT and the PAT may comprise a corresponding one or both of interpolating 310 the time-sampled data at an output of the ADC for the RTT and interpolating 310 the time-sampled data stored in the memory for the PAT. Further, the RTT may terminate one or both of acquiring time-sampled data and storing the time-sampled data, according to some embodiments (not illustrated).

Thus, there have been described examples and embodiments of a trigger event detector, a data acquisition system, and a method of trigger event detection that employ interpolation in conjunction with finite state machine-based trigger event detection. It should be understood that the above-described examples are merely illustrative of some of the many specific embodiments and examples that represent the principles described herein. Clearly, those skilled in the art can readily devise numerous other arrangements without departing from the scope as defined by the following claims.

What is claimed is:

1. A trigger event detector comprising:
    an interpolator configured to interpolate time-sampled data and to provide an interpolated sequence of data; and
    a finite state machine (FSM) having a plurality of predefined states including a trigger event state, the FSM being configured to transition among the predefined states according to an ordered sequence of symbols corresponding to the interpolated sequence of data,
    wherein a transition of the FSM into the trigger event state represents detection of a trigger event, the trigger event detection providing one or both of a real-time trigger (RTT) and a post-acquisition trigger (PAT).

2. The trigger event detector of claim 1, wherein the interpolator is further configured to receive the time-sampled data from an analog-to-digital converter (ADC), the time-sampled data sequence representing time samples of an analog signal.

3. The trigger event detector of claim 1, wherein the interpolator is further configured to receive the time-sampled data from a memory, the memory being configured to store the time-sampled data sequence prior to interpolation by the interpolator.

4. The trigger event detector of claim 1, wherein the interpolator is configured to interpolate the time-sampled data sequence according to a Whittaker-Shannon interpolation.

5. The trigger event detector of claim 1, wherein the interpolated data sequence has a time resolution that is at least twice a time resolution of the time-sampled data sequence.

6. The trigger event detector of claim 1, further comprising a symbol generator located between the interpolator and the FSM, the symbol generator being configured to map the interpolated data sequence into the ordered sequence of symbols, the ordered sequence of symbols comprising a plurality of different symbols, wherein each different symbol represents a different range of values of the interpolated data sequence.

7. The trigger event detector of claim 6, wherein the plurality of different symbols includes at least three different symbols.

8. The trigger event detector of claim 1, further comprising:
    an analog-to-digital converter configured to receive an analog signal and to convert the analog signal into the time-sampled data sequence; and
    a memory configured to store one or both of the time-sampled data sequence and the interpolated data sequence,
    wherein the RTT is configured to terminate conversion of the analog signal into the time-sampled data sequence, and wherein the PAT is configured to establish a timing of the trigger event within the memory-stored data.

9. A digital oscilloscope comprising the trigger event detector of claim 1, the trigger event detector being configured to selectively provide the RTT to terminate data acquisition by the digital oscilloscope upon trigger event detection and provide the PAT to establish a timing of the trigger event within the time-sampled data sequence stored in a memory of the digital oscilloscope.

10. A data acquisition system with finite state machine-based trigger event detection, the data acquisition system comprising:
    an analog-to-digital converter (ADC) configured to receive an analog signal and convert the analog signal into time-sampled digital data;
    an interpolator configured to provide interpolated digital data from the time-sampled digital data;
    a symbol generator configured to map the interpolated digital data into an ordered sequence of symbols, a symbol representing a predetermined range of digital values of the interpolated digital data; and
    a finite state machine (FSM) configured to transition among a predefined set of states according to the ordered sequence of symbols,
    wherein trigger event detection of a trigger event comprises a transition of the FSM into a trigger event state of the predefined set of states.

11. The data acquisition system of claim 10, wherein the trigger event detection is configured to provide one or both of a real-time trigger (RTT) and a post-acquisition trigger (PAT), the RTT being configured to terminate conversion of the analog signal into the time-sampled digital data by the ADC, the PAT being configured to establish a timing of the trigger event within the interpolated digital data.

12. The data acquisition system of claim 10, further comprising a memory configured to store one or both of the time-sampled digital data and the interpolated digital data, wherein the interpolator is further configured to selectively receive the time-sampled digital data either from the memory to implement a post-acquisition trigger or from the ADC to implement a real-time trigger of the data acquisition system.

13. The data acquisition system of claim 10, wherein a time resolution of the interpolated digital data provided by the interpolator has at least twice a time resolution of the time-sampled digital data.

14. The data acquisition system of claim 10, wherein the ordered sequence of symbols comprises symbols selected from a set of at least three different symbols, each of the different symbols representing a respective different range of digital values of the interpolated digital data.

15. The data acquisition system of claim 14, wherein a total range of digital values of the interpolated data is divided into substantially equal-sized different portions, each of the different symbols represents a different one of the substantially equal-sized different portions.

16. The data acquisition system of claim 10, wherein the data acquisition system is a digital oscilloscope.

17. A method of trigger event detection, the method comprising:
    interpolating time-sampled data using an interpolator to provide an interpolated sequence of data;
    generating an ordered sequence of symbols corresponding to the interpolated data sequence using a symbol generator to map data points of the interpolated data sequence into symbols representing digital values of the data points;
    transitioning a finite state machine (FSM) among a plurality of predefined states according to the ordered sequence of symbols, the predefined states including a trigger event state;
    detecting a trigger event as a transition of the FSM into the trigger event state; and
    providing one or both of a real-time trigger (RTT) and a post-acquisition trigger (PAT) upon detection of the trigger event.

18. The method of trigger event detection of claim 17, further comprising:
    acquiring the time-sampled data using an analog-to-converter (ADC) to sample an analog signal and to convert the analog signal into digital samples of the time-sampled data; and
    storing the time-sampled data in a memory,
    wherein providing one or both of the RTT and the PAT comprises a corresponding one or both of interpolating the time-sampled data at an output of the ADC for the RTT and interpolating the time-sampled data stored in the memory for the PAT.

19. The method of trigger event detection of claim 18, wherein the RTT terminates one or both of acquiring the time-sampled data and storing the time-sampled data.

20. The method of trigger event detection of claim 17, wherein interpolating the time-sampled data sequence comprises performing a Whittaker-Shannon interpolation, the interpolated data sequence having a time resolution that is at least twice a time resolution of the time-sampled data.

* * * * *